United States Patent
De Sandre et al.

(10) Patent No.: US 7,088,614 B2
(45) Date of Patent: Aug. 8, 2006

(54) PROGRAMMING METHOD FOR A MULTILEVEL MEMORY CELL

(75) Inventors: Guido De Sandre, Brugherio (IT); Marco Poles, Ghedi (IT); David Iezzi, Osnago (IT); Marco Pasotti, San Martino Sicc. (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 467 days.

(21) Appl. No.: 10/331,161

(22) Filed: Dec. 26, 2002

(65) Prior Publication Data

US 2003/0159014 A1    Aug. 21, 2003

(30) Foreign Application Priority Data

Dec. 28, 2001   (EP) ................................ 01830827

(51) Int. Cl.
*G11C 18/04* (2006.01)
(52) U.S. Cl. .............................. 365/185.03; 365/185.2; 365/185.18; 365/185.19; 365/185.22; 365/185.24
(58) Field of Classification Search ........... 365/185.03, 365/185.2, 185.18, 185.19, 185.22, 185.24
See application file for complete search history.

(56) References Cited

U.S. PATENT DOCUMENTS

| 5,687,114 | A | * | 11/1997 | Khan | ................... | 365/185.03 |
|---|---|---|---|---|---|---|
| 6,002,614 | A | * | 12/1999 | Banks | ................... | 365/189.01 |
| 6,034,892 | A | * | 3/2000 | Choi | ................... | 365/185.14 |
| 6,064,597 | A | * | 5/2000 | Takeshima et al. | .... | 365/185.24 |
| 6,246,608 | B1 | * | 6/2001 | Odani | ................... | 365/185.2 |
| 6,304,485 | B1 | | 10/2001 | Harari et al. | ........... | 365/185.09 |
| 6,317,364 | B1 | * | 11/2001 | Guterman et al. | ...... | 365/185.28 |
| 6,347,053 | B1 | * | 2/2002 | Kim et al. | ............. | 365/185.24 |
| 6,522,580 | B1 | * | 2/2003 | Chen et al. | ............ | 365/185.02 |
| 6,643,181 | B1 | * | 11/2003 | Sofer et al. | ............ | 365/185.22 |
| 6,667,903 | B1 | * | 12/2003 | De Sandre et al. | ...... | 365/185.03 |
| 6,816,407 | B1 | * | 11/2004 | Rolandi | ................. | 365/185.03 |
| 6,836,432 | B1 | * | 12/2004 | Parker et al. | .......... | 365/185.03 |
| 2004/0004857 | A1 | * | 1/2004 | Manea | ................... | 365/185.03 |

FOREIGN PATENT DOCUMENTS

| EP | 0 656 628 A2 | 6/1995 |
|---|---|---|
| WO | WO 97/12368 | 4/1997 |

\* cited by examiner

*Primary Examiner*—Viet Q. Nguyen
(74) *Attorney, Agent, or Firm*—Lisa K. Jorgenson; Robert Iannucci; Seed IP Law Group PLLC

(57) ABSTRACT

A programming method of a multilevel memory cell is able to store a plurality of bits in a plurality of levels. The method includes writing a logic value in the multilevel memory cell by setting one of the programming levels thereof, these levels being included in the plurality of levels, with respect to a reference level according to the symbol to be written and to a previous programming level. The writing step is repeated until a highest possible value for the levels is reached. A multilevel memory device includes a plurality of multilevel memory cells organized into sectors, split into a plurality of data units whereon a programming operation is performed in parallel.

25 Claims, 2 Drawing Sheets

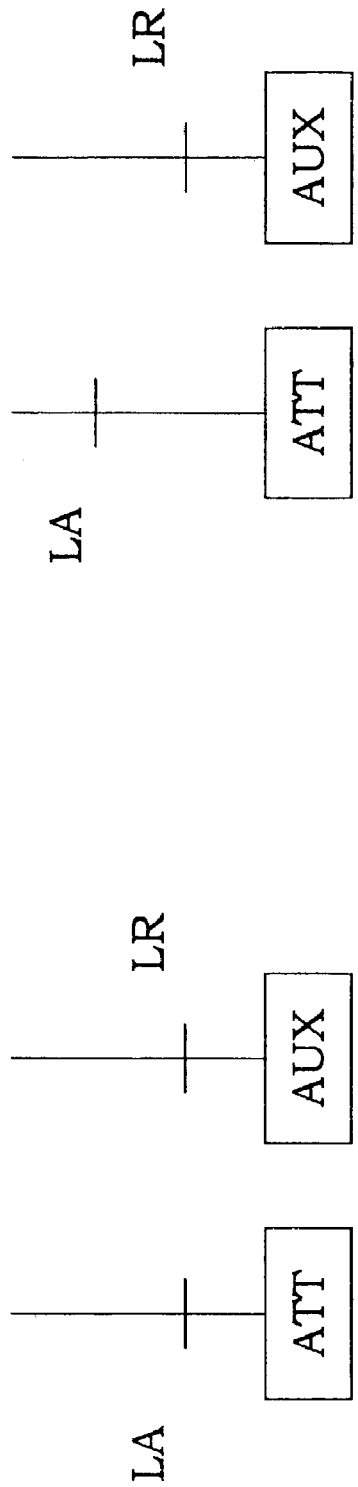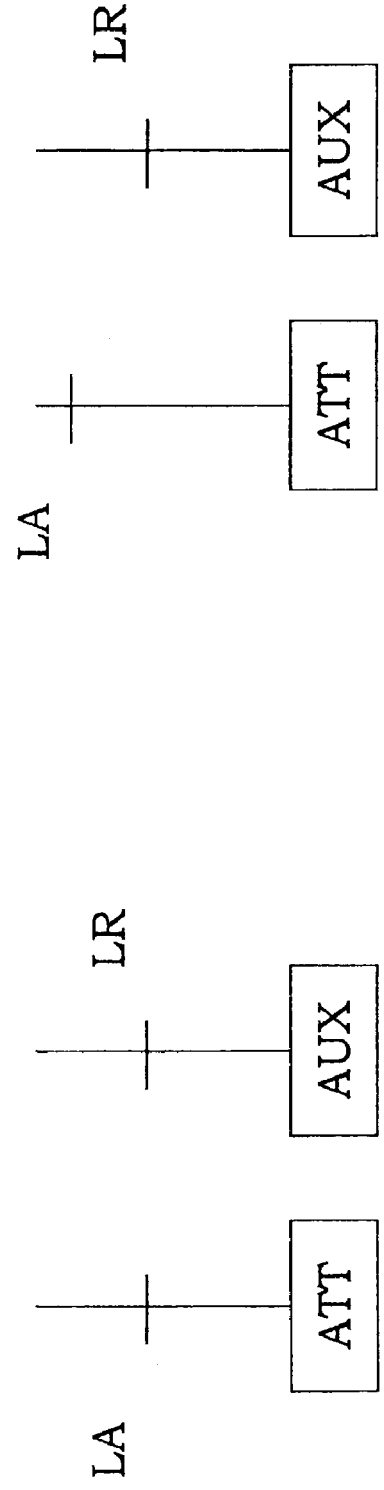

PROGRAMMING METHOD FOR A MULTILEVEL MEMORY CELL

BACKGROUND OF THE INVENTION

1. Field of the Invention

The present invention relates to a programming method for a multilevel memory cell able to store a plurality of bits in a plurality of levels.

The invention further relates to a multilevel memory device comprising a plurality of multilevel memory cells organized into sectors, the sectors being split into a plurality of data units wherein a programming operation is performed in parallel.

The invention relates, particularly but not exclusively, to a Flash memory device, and the following description is made with reference to this application field with the only aim of simplifying illustration.

2. Description of the Related Art

As it is well known, in the Flash memory field, the multilevel technique is now widely accepted as a means to increase data density, with an equal physical density of the memory cells.

Known are multilevel memory devices which can store several logic values in a single memory cell. These devices are made in the form of integrated electronic circuits, which have achieved a sufficient degree of reliability to allow their large scale production for several technical and commercial applications.

The market of semiconductor integrated electronic devices is showing great interest in multilevel memory devices because they can offer information storage densities which are at least double in comparison with two-level memory devices, both by using the same technology and the same circuit area occupation.

The operation of such multilevel memory devices will now be briefly described. The different programming state of a memory cell results in a different value of the threshold voltage Vth thereof.

Of course, for a two-level cell, there can be only two values, corresponding to a logic 0 and a logic 1 respectively. In this case, the amount of information that can be stored is equal to one bit per cell.

Instead, a multilevel memory cell can store more than one bit. From the electrical point of view, this results in more than two possible threshold voltage values. The amount of information that can be stored in a single multilevel cell increases according to the following relation:

Number of bits per cell=$\log_2$(number of values of Vth)

From the physical point of view, the possibility of altering the threshold voltage Vth, and therefore of programming the multilevel memory cell, is realized by the floating gate structure of the transistor which form the memory cell. The gate region is DC-isolated but it can be accessed by charge injection processes of the Channel Hot Electrons and/or Fowler-Nordheim Tunneling Effect type.

When suitably controlled, these processes allow the amount of charge caught in the floating gate to be modulated, thereby allowing the effect of the latter on the threshold voltage Vth value to be changed.

The possibility of generating, in a large number of cells, a set of threshold voltage levels which can be distinguished from each other upon reading is thus used to increase the density of the stored data.

However, the multilevel technique has inherently the disadvantage of slowing the processes of reading and programming each cell.

Additionally, there are applications—e.g., the implementation of a FAT memory for disk-on-silicon embodiments—which require the writing of small amounts of data, usually at non-contiguous addresses, for which the programming times are significantly longer.

In fact these applications require, for data updating, erasing/programming cycles to be performed. Considering the time taken by such operations, two major problems stand out:

the updating time per bit becomes unacceptable if the amount of data to be updated is small;

an auxiliary memory is needed to store data not to be updated, which data are nevertheless erased, the erasing being carried simultaneously out on a whole sector.

These problems make the use of current Flash memory architectures improposable.

Furthermore, power consumption is critical to such applications: all the energy used to store data which require no updating, but which are involved in the erasing/programming process, is lost with respect to the updating operation.

Power usage is the more inefficient the smaller is the ratio between the data to be updated and the sector size.

BRIEF SUMMARY OF THE INVENTION

An embodiment of the present invention provides a method of programming Flash memory cells, having such structural and functional features as to allow the updating time per bit to be reduced, along with the power consumption of the memory device during this programming operation, thereby overcoming the drawbacks which currently limit the programming methods of Flash memory devices performed according to the prior art.

The method determines the level of the cell to be programmed differentially with respect to a reference level of an auxiliary cell, depending on the symbol to be programmed and the previously programmed level.

The features and advantages of the programming method and multilevel memory devices according to the invention will be apparent from the following description, of an embodiment thereof, given by way of non limiting example with reference to the accompanying drawing.

BRIEF DESCRIPTION OF THE SEVERAL VIEWS OF THE DRAWINGS

In the drawings.

FIGS. from 1A to 1D: they schematically show the operation of a programming method according to the invention in different operating conditions.

DETAILED DESCRIPTION OF THE INVENTION

Figure 2:
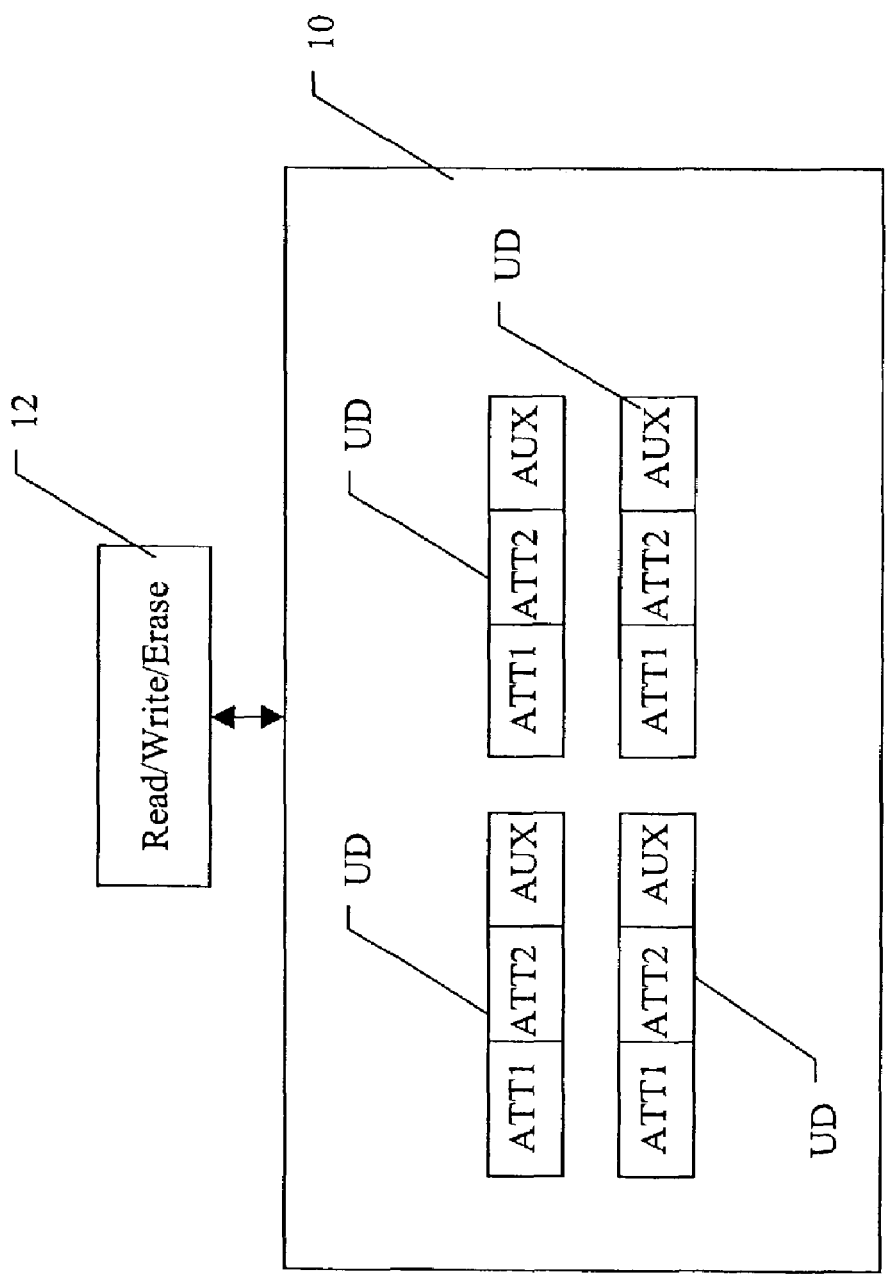
FIG. 2 is a multilevel memory device according to an embodiment of the invention.

As seen with reference to the prior art, a multilevel cell, with n bits per cell, is programmed on m=$2^n$ levels, where m is an integer number lower than the total number N of levels, that are denoted with $L_0, L_1, \ldots, L_{N-1}$.

The programming method of a multilevel memory cell according to an embodiment of the invention provides a step of writing a logic binary value in the multilevel memory cell by setting the level LA thereof in the plurality of levels N according to the following relation:

when writing a logic value "0", the cell level LA is set equal to a reference level LR;

when writing a logic value "1", the cell level LA is set greater than this reference level LR.

In particular:

starting from equal levels, writing a logic value "0" does not involve any level increase, while writing a logic value "1" involves an increase in the level LA of the cell to be programmed;

starting from a level LA of the cell to be programmed greater than the reference level LR, writing a logic value "1" does not involve any level increase, while writing a logic value "0" involves an increase in the reference value LR thereby returning to equal levels;

starting from a level LA of the cell to be programmed lower than the reference level LR, writing a logic value "0" involves an increase in the level LA of the cell to be programmed thereby returning to equal levels, while writing a logic value "1" involves a double increase in the level LA of the cell to be programmed in order to bring it above the reference level LR.

The programming method also provides this writing step to be repeated for the memory cell in reference until the highest possible value Lmax is reached for these levels, this value Lmax being equal to $L_{N-1}$, the (N-1)th level.

It is only at this point that a step of erasing the memory cell and a step of resetting updated data are performed in order to restart the writing process without erasing.

Advantageously, the suggested writing method without erasing allows the limit of N−2 reprogrammings (in case of one bit per cell) or, more generally, of $N_R=(N-2^n)/(2^n-1)$ reprogrammings (in case of n bit per cell) to be overcome.

In particular, in the case of Flash multilevel memory cells, it is worth noting that these erasing and resetting steps affect all the memory cells belonging to a given sector.

Accordingly, differently from the prior art, the sector updating and erasing steps occur only after the performance of all the possible writings with considerable savings in terms of time and power consumption by the memory device using this method.

Advantageously, the above-described programming method is implemented by a multilevel memory device that includes an array 10 of memory cells and associated read/write/erase circuitry 12 for reading from, writing to, and erasing the memory cells, as shown in FIG. 2. The array 12 is organized into sets of cells, each set being referred to as a data unit UD. Advantageously, each data unit UD includes one or more active memory cells ATT1, ATT2 and an auxiliary memory cell indicated with AUX.

The auxiliary memory cell AUX has the function of indicating the programming level reference, referred to as reference level LR. Initially, the reference level LR of the auxiliary cell AUX is associated to the first possible value $L_0$.

For example, in the two-level case {"0","1"} wherein a bit per cell is stored, this reference level LR is initially equal to $L_0$; similarly, in the four-level multilevel case, {"0","1","2","3"}, wherein two bits per cell are stored, this reference level LR is initially still equal to $L_0$.

The order of the symbols used in the examples shown can be obviously modified, without altering the scope of the invention.

It will now be considered, by way of example, the situation wherein:

$N=16$ $n=1 \Rightarrow m=2$ i.e., a bit per cell out of a total of sixteen levels programmed two at a time.

It will be also assumed that the data unit UD comprises only one cell, hereafter referred to as active cell ATT. In this simplified example, schematically shown in FIGS. 1A and 1B, each auxiliary cell AUX corresponds to one single active cell ATT of the data unit UD.

Initially, the reference level LR corresponds to a level $LR=L_0$, i.e., to the first programmable level. The active cell ATT is similarly at a level LA corresponding to the logic value to be stored.

In the above-described programming method, writing a logic value "0" in the cell corresponds to a parity situation between the levels of the auxiliary cell AUX and of the active cell ATT (LR=LA), while writing a logic value "1" in the cell corresponds to a predominance situation of the level of the active cell ATT with respect to the level of the auxiliary cell AUX (LA>LR).

Advantageously, during each following writing step, the levels LR and LA are differentially increased according to the above-indicated rule to obtain the writing of the desired logic value, the multilevel cell programming continuing without performing any erasing operation until these levels reach the highest level available (in this case equal to 15).

In particular, the level LA of the active cell ATT is not necessarily increased during each writing, but only in the absence of the right relation between the levels LR and LA.

It will be considered initially the case wherein the writing of a logic value "0" in the active cell ATT is required. The reference level LR being at a value $L_0$, the level LA of the active cell 1 must also be at the value $L_0$, as schematically shown in FIG. 1A.

To store a logic value "1", the active cell ATT reaches the level $LA=L_1$, as schematically shown in FIG. 1B.

If at this point an overwriting of a logic value "0" is required, the active cell ATT is kept unchanged, while the reference level LR of the auxiliary cell AUX is brought to $L_1$, as schematically shown in FIG. 1C.

Writing again a logic value "1", the reference level LR is kept fixed, while the active cell ATT reaches the level $LA=L_2$, to obtain the desired level inequality (LA>LR), as schematically shown in FIG. 1D.

It is thus possible to write a series of logic values "0" and "1" until the reference level LR reaches a value Lmax corresponding to the highest possible value (in this case $Lmax=L_{15}$).

It is only at this point that the steps of sector erasing and updated data reset are performed in order to restart the programming process without erasing.

Also the auxiliary cell AUX is erased and the level thereof is reset at the initial value $LR=L_0$.

The lowest number of rewritings of the active cell ATT without erasing that can be performed is, in this case, equal to 29. This is however only the worst case occurring only if, each time that the data on the active cell is updated, a transition "1"→"0" or "0"→"1" occurs, that is in the case of the sequence:

"1","0","1","0","1","0","1", . . .

On the contrary, in the case of a general sequence, as for example:

"0","1","1","0","1","0","0","0","1","1","1","0","1",
   "0","0", . . .

the level LA of the active cell ATT or the reference level LR of the auxiliary cell AUX are changed only in the presence of a transition of logic value to be written and not when maintaining a same logic value being written in the active cell ATT. In this case it is thus evident that several writings are possible without need to change the level LA of the active cell ATT or the reference level LR of the auxiliary cell AUX.

The programming method here described is usable also for programming with more bits per cell. In fact, assuming that:

N=16 n=2=>m=4

As previously seen, both the reference level LR of the auxiliary cell AUX and the level LA of the active cell ATT are initially at the level $L_0$. Having to write on the active cell ATT the sequence of symbols:

"1","3","2","0","2","1", . . .

the following operations are performed:

| Symbol To be written | Level LA Cell ATT | Level LR Cell AUX |
|---|---|---|
| "1" | $L_0 \to L_1$ | |
| "3" | $L_1 \to L_3$ | |
| "2" | | $L_0 \to L_1$ |
| "0" | | $L_1 \to L_3$ |
| "2" | $L_3 \to L_5$ | |
| "1" | | $L_3 \to L_4$ |

It is easy to verify that the lowest number of writing steps without erasing is equal to 9 and it can be obtained with the sequence:

"3","0","3","0","3","0","3", . . .

which is the worst case.

A general sequence (and therefore much more possible) allows instead a greater number of possible writing steps to be reached before the erasing step.

The application field of the method according to the invention can be easily extended to understand the case of more active cells for each auxiliary cell AUX. It will now be considered, by way of example, the case of two active cells ATT1, ATT2 for an auxiliary cell AUX and assumed that:

N=16 n=1=>m=2

In this case sequences of symbol pairs like the following one must be considered:

"10","00","11","10","01","00","01","11","00", . . .

The operations to be performed on flash active cells are in this case:

| Symbol To be written | Cell ATT2 level | Cell ATT1 level | Level LR cell AUX |
|---|---|---|---|
| "10" | $L_0 \to L_1$ | | |
| "00" | | $L_0 \to L_1$ | $L_0 \to L_1$ |
| "11" | $L_1 \to L_2$ | $L_1 \to L_2$ | |
| "10" | $L_2 \to L_3$ | | $L_1 \to L_2$ |
| "01" | | $L_2 \to L_4$ | $L_2 \to L_3$ |
| "00" | $L_3 \to L_4$ | | $L_3 \to L_4$ |
| "01" | | $L_4 \to L_5$ | |
| "11" | $L_4 \to L_5$ | | |
| "00" | | | $L_4 \to L_5$ |

Similarly, the extension is valid for two or more bits, or for three or more active cells for each auxiliary cell.

An increase in the active cells in the data unit UD allows the percentage of the area usable for the storing to be increased, at the cost of a greater possibility of transition in the sequences of symbols.

In conclusion, the programming method uses therefore a complete multilevel architecture and is characterized by the logic function which determines the following programming levels of the active cells and of the auxiliary cell, starting from the symbol to be written and the present programming levels.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A programming method for a multilevel memory cell able to store a plurality of bits in a plurality of levels, the method comprising: writing a logic value in said multilevel memory cell by setting a programming level of the cell at one of said plurality of levels with respect to a reference level based on a symbol to be written and on a previous programming level, wherein said writing step is repeated until a highest possible value for said levels is reached, wherein the reference level is stored in an auxiliary cell.

2. The programming method according to claim 1, wherein said programming level of said cell to be programmed is set according to the following relation:
   when writing a first logic value, said programming level of said cell is set equal to the reference level;
   when writing a second logic value, said programming level of said cell is set greater than said reference level.

3. The programming method according to claim 2, wherein said programming level of said cell to be programmed is set according to the following relation:
   starting from equal levels of the programming level and the reference level, a writing operation of said first logic value does not involve any increase in said programming level and of said reference level, while writing said second logic value involves an increase in said programming level of said cell to be programmed;
   starting from a programming level of said cell to be programmed higher than said reference level, a writing operation of said second logic value does not involve any increase in said programming level and in said reference level, while a writing operation of said first logic value involves an increase in said reference level to bring said levels back to parity conditions;

starting from a programming level of said cell to be programmed lower than said reference level, a writing operation of said first logic value involves an increase in said programming level of said cell to be programmed which brings said levels back to parity conditions, while a writing operation of said second logic value "1" involves a double increase in said programming level of said cell to be programmed to bring said programming level above said reference level.

4. The programming method according to claim 1, further comprising: erasing said memory cell and resetting updated data only when said highest possible value is reached.

5. The programming method according to claim 1, wherein said highest possible value is equal to the number of levels in said plurality of levels less 1.

6. A multilevel memory device, comprising:

a memory array including a plurality of multilevel memory cells each able to store a plurality of bits in a plurality of levels, the memory array being organized into a plurality of data units each data unit including an active cell and an auxiliary cell having a level corresponding to a reference level; and programming means for writing a logic value in a selected one of the data units by setting a programming level of the selected data unit at one of said plurality of levels with respect to the reference level based on a symbol to be written in the data unit and on a previous programming level.

7. The multilevel memory device according to claim 6, wherein said reference level of said auxiliary cell is initially set at a value corresponding to a lowest possible level.

8. The multilevel memory device according to claim 6, wherein said reference level of said auxiliary cell and said programming level of said data unit are increased differentially according to the symbol to be written and to a previous programming level without performing an erasing operation until said reference level reaches a highest possible value.

9. The multilevel memory device according to claim 8, wherein, when said reference level reaches said highest possible value, said programming means performs updated data erasing and resetting steps on said data unit, including on said auxiliary cell, the level of the auxiliary cell being reset at an initial value.

10. The multilevel memory device according to claim 6, wherein said data unit comprises only one active cell in addition to said auxiliary cell.

11. The multilevel memory device according to claim 6, wherein said data unit comprises a plurality of active cells to be programmed in addition to the auxiliary cell, the levels of the active cells and auxiliary cell being increased differentially according to the symbol to be written and to the previous programming levels without performing an erasing operation until said reference level reaches a highest possible value.

12. A multilevel memory device, comprising:

a memory array including a plurality of multilevel memory cells each able to store a plurality of bits in a plurality of levels, the memory array being organized into a plurality of data units, each data unit including an active cell and an auxiliary cell having a level corresponding to a reference level; and programming means for writing a logic value in a selected one of the data units by increased differentially the levels of the active cell and auxiliary cell according to a symbol to be written and according to previous programming levels without performing an erasing operation until said reference level reaches a highest possible value.

13. The device of claim 12, wherein said reference level of said auxiliary cell is initially set at a value corresponding to a lowest possible level.

14. The device of claim 12, wherein, when said reference level reaches said highest possible value, said programming means performs updated data erasing and resetting steps on said data unit, including on said auxiliary cell, the level of the auxiliary cell being reset at an initial value.

15. The device of claim 12, wherein said selected data unit comprises only one active cell in addition to said auxiliary cell.

16. The device of claim 12, wherein said selected data unit comprises a plurality of active cells to be programmed in addition to the auxiliary cell, the levels of the active cells and auxiliary cell being increased differentially according to the symbol to be written and to the previous programming levels without performing an erasing operation until said reference level reaches the highest possible value.

17. A programming method for a multilevel memory cell able to store a plurality of bits in a plurality of levels, the method comprising: writing a logic value in said multilevel memory cell by setting a programming level of the cell at one of said plurality of levels with respect to a reference level based on a symbol to be written and on a previous programming level, wherein said writing step is repeated until a highest possible value for said levels is reached, wherein said programming level of said cell to be programmed is set according to the following relation:

when writing a first logic value, said programming level of said cell is set equal to the reference level;

when writing a second logic value, said programming level of said cell is set greater than said reference level.

18. The programming method according to claim 17, wherein said programming level of said cell to be programmed is set according to the following relation:

starting from equal levels of the programming level and the reference level, a writing operation of said first logic value does not involve any increase in said programming level and of said reference level, while writing said second logic value involves an increase in said programming level of said cell to be programmed;

starting from a programming level of said cell to be programmed higher than said reference level, a writing operation of said second logic value does not involve any increase in said programming level and in said reference level, while a writing operation of said first logic value involves an increase in said reference level to bring said levels back to parity conditions;

starting from a programming level of said cell to be programmed lower than said reference level, a writing operation of said first logic value involves an increase in said programming level of said cell to be programmed which brings said levels back to parity conditions, while a writing operation of said second logic value "1" involves a double increase in said programming level of said cell to be programmed to bring said programming level above said reference level.

19. The programming method according to claim 17, further comprising: erasing said memory cell and resetting updated data only when said highest possible value is reached.

20. The programming method according to claim 17, wherein said highest possible value is equal to the number of levels in said plurality of levels less 1.

21. A programming method for a multilevel memory cell able to store a plurality of bits in a plurality of levels, the method comprising:
  writing a logic value in said multilevel memory cell by setting a programming level of the cell at one of said plurality of levels with respect to a reference level based on a symbol to be written and on a previous programming level, wherein said writing step is repeated until a highest possible value for said levels is reached; and
  erasing said memory cell and resetting updated data only when said highest possible value is reached.

22. The programming method according to claim 21, wherein said programming level of said cell to be programmed is set according to the following relation:
  when writing a first logic value, said programming level of said cell is set equal to the reference level;
  when writing a second logic value, said programming level of said cell is set greater than said reference level, wherein said programming level of said cell to be programmed is set according to the following relation:
  starting from equal levels of the programming level and the reference level, a writing operation of said first logic value does not involve any increase in said programming level and of said reference level, while writing said second logic value involves an increase in said programming level of said cell to be programmed;
  starting from a programming level of said cell to be programmed higher than said reference level, a writing operation of said second logic value does not involve any increase in said programming level and in said reference level, while a writing operation of said first logic value involves an increase in said reference level to bring said levels back to parity conditions;
  starting from a programming level of said cell to be programmed lower than said reference level, a writing operation of said first logic value involves an increase in said programming level of said cell to be programmed which brings said levels back to parity conditions, while a writing operation of said second logic value "1" involves a double increase in said programming level of said cell to be programmed to bring said programming level above said reference level.

23. The programming method according to claim 21, wherein said highest possible value is equal to the number of levels in said plurality of levels less 1.

24. A programming method for a multilevel memory cell able to store a plurality of bits in a plurality of levels, the method comprising: writing a logic value in said multilevel memory cell by setting a programming level of the cell at one of said plurality of levels with respect to a reference level based on a symbol to be written and on a previous programming level, wherein said writing step is repeated until a highest possible value for said levels is reached, wherein said highest possible value is equal to the number of levels in said plurality of levels less 1.

25. The programming method according to claim 24, wherein said programming level of said cell to be programmed is set according to the following relation:
  when writing a first logic value, said programming level of said cell is set equal to the reference level;
  when writing a second logic value, said programming level of said cell is set greater than said reference level, wherein said programming level of said cell to be programmed is set according to the following relation:
  starting from equal levels of the programming level and the reference level, a writing operation of said first logic value does not involve any increase in said programming level and of said reference level, while writing said second logic value involves an increase in said programming level of said cell to be programmed;
  starting from a programming level of said cell to be programmed higher than said reference level, a writing operation of said second logic value does not involve any increase in said programming level and in said reference level, while a writing operation of said first logic value involves an increase in said reference level to bring said levels back to panty conditions;
  starting from a programming level of said cell to be programmed lower than said reference level, a writing operation of said first logic value involves an increase in said programming level of said cell to be programmed which brings said levels back to parity conditions, while a writing operation of said second logic value "1" involves a double increase in said programming level of said cell to be programmed to bring said programming level above said reference level.

* * * * *